United States Patent [19]

Brasfield

[11] Patent Number: 4,656,416
[45] Date of Patent: Apr. 7, 1987

[54] METHOD AND APPARATUS FOR LOCATING SHORT CIRCUITS

[75] Inventor: Laurence C. Brasfield, Mercer Island, Wash.

[73] Assignee: Applied Microsystems Corporation, Redmond, Wash.

[21] Appl. No.: 637,426

[22] Filed: Aug. 3, 1984

[51] Int. Cl.⁴ ............................................. G01R 31/08
[52] U.S. Cl. ........................................ 324/52; 324/133
[58] Field of Search ................. 324/51, 52, 73 PC, 133

[56] References Cited

U.S. PATENT DOCUMENTS

| | | | |
|---|---|---|---|
| 3,828,256 | 8/1974 | Liv | 324/133 |
| 3,838,339 | 9/1974 | Brandt | 324/133 |
| 3,975,680 | 8/1976 | Webb | 324/73 PC X |
| 4,362,987 | 12/1982 | Clinton | 324/52 |

FOREIGN PATENT DOCUMENTS

| | | | |
|---|---|---|---|
| 2143954 | 2/1985 | United Kingdom | 324/73 PC |
| 0382031 | 8/1973 | U.S.S.R. | 324/73 PC |

*Primary Examiner*—Stanley T. Krawczewicz
*Attorney, Agent, or Firm*—Seed and Berry

[57] ABSTRACT

A first process is used to identify the second circuit to which the shorted circuit is connected. A low-level, A.C. potential is imposed between the node known to be shorted and a common trace. A high impedance probe is scanned over the circuits at a distance. The potential detected is filtered and compared with the impressed potential. The result is filtered, amplified, and synchronously demodulated and the result displayed.

The second process is used to locate the site of the short. A low-level AC current is injected between two shorted traces. Points along the traces are contacted by a high impedance probe. The signal is filtered and compared with the impressed potential. The result of the comparison is further filtered, amplified, synchronously demodulated and the result displayed.

A shorts locator is under the control of a central processing unit. Clips permit connection to the system under test. The clip potentials are monitored. A high impedence probe circuit which includes filtering and buffering circuitry, provides an output signal which compared to probe circuitry potentials. An excitation circuit provides and AC test signal applied by means of the clips. The probe and clip circuitry potentials are passed through a narrow bandpass amplifier. The resulting signal is demodulated by an intergrator which has synchronously reversed polarity. The output is passed through an analog to digital converter and passed to the central processor for processing and display.

14 Claims, 8 Drawing Figures

METHOD AND APPARATUS FOR LOCATING SHORT CIRCUITS

TECHNICAL FIELD

The invention provides a method and apparatus for identifying which networks are shorted together and then locating the actual physical short.

BACKGROUND OF THE INVENTION

Short circuits are a common cause of problems in newly manufactured printed circuit boards. Newly manufactured printed circuit boards often contain shorts between traces which prevent the circuits on the board from functioning properly. The difficulty of identifying and locating a short can vary with the function of the circuits or area of the circuits involved. When the short is between two traces, such as signal traces, it may go unidentified for some time. If the short occurs in a critical area of the board, such as within the connections intimate to a microprocessor found on the board it may be very difficult and may not be cost effective to identify and locate such a short.

On printed circuit boards, in the past, locating the shorts has created a great deal of difficulty. Circuits which are intimate to the microprocessor in an electrical sense may, in fact, be spread throughout the printed circuit board which may be quite large. The problem in finding the short is that the two shorted traces may be adjacent to each other at many points throughout the board. In the past, these points may be found only through tedious and error prone visual inspection of a blank board. If the board has components mounted on it, the visual inspection is made even more difficult.

Some of these shorts, which are often residual copper left on the board in manufacture, are so fine as to be virtually invisible without the aid of a low power microscope. While some shorts may actually be large blobs of copper solder, some may actually be traces placed on the board due to a revision of the board coupled with a layout error. Sometimes, the short may be located on an inner layer of the multi-layer board and therefore is not visually identifiable.

In the past, attempts have been made to by-pass the visual searching techniques by using the fact that the short completes a circuit where this circuit should not be completed at all. A relatively high current, low voltage signal is injected into the two circuits that are not supposed to be connected but are connected by means of the short. By tracing the voltage drop from one injection point to the other, the short is found at the point where the voltage drop passes from one trace to an adjacent trace. Milli-ohmmeters have been used in this regard to locate shorts. This method is subject to many problems. For example, there can be no power applied to the circuit board while it is being tested. The Milli-ohmmeter may drift causing erronous readings. Contact resistance of the probes may vary from point to point, causing misleading readings.

Another technique which has been used in the past is to use a Hall effect device in a special pröbe to "sniff" current flowing through the trace. This method may not work when the failure is on an inner layer of a multi-layer circuit board and also is sensitive to other electromagnetic fields which may be present.

DISCLOSURE OF THE INVENTION

The invention relates to a method and apparatus for locating short circuits in printed circuit boards and in other circuits. Two processes are involved.

In the first process, referred to as the field mode, the printed circuit board is searched in order to identify the second circuit to which the first circuit is connected. In this mode, a low-level, AC potential is imposed between the node known to be shorted and a ground trace or other common trace on the printed circuit board. A high impedance probe is scanned over the printed circuit board at a distance to determine those areas where the electric field comes closer to the shorted node potential than the reference potential. The potential detected by the probe is filtered and defines with respect to the impressed potential. The result is filtered, amplified, and synchronously demodulated and then the result is displayed.

The second method referred to as the trace mode, is used to locate the physical site of the short. A low-level alternating current is injected so as to flow between the two shorted networks via the short. Points along the traces on the circuit board are contacted by a high impedance probe. The signal picked up by the high impedance probe is filtered and delivered with respect to the impressed signal. The result of the comparison is further filtered, amplified and synchronously demodulated. The result is then displayed.

The shorts locator includes excitation and signal processing circuitry which is under the control of a central processing unit which includes memory. System controls and avisual display are connected to the central processing unit. System excitation and signal processing circuitry operates under the control of the central processing unit. The signal processing circuitry includes clips which permit connection to the system under test. The clip potentials are monitored through filtering and buffering circuitry. A high impedance probe connected to filtering and buffering circuitry provides an output signal which is compared to chip circuitry potentials. An excitation circuit provides an AC test signal which is applied to the system under test by means of the clips. The result of probe and clip circuitry comparison is passed through a band pass filter and amplifier. The resulting signal is demodulated through the use of an intergrator which has a synchronously reversed polarity. The output is passed through a analog todigital converter and then passed to the central processor for processing and display.

BEST MODE FOR CARRYING OUT THE INVENTION

The preferred methods and the preferred embodiment of an apparatus implementing the short locator methods are described below.

The implementation of the invention will be discussed in terms of location of the shorts on a printed circuit board although other applications are possible.

In order to locate short circuits on a printed circuit board, two processes are involved.

In the first process, referred to as the field mode, the printed circuit board is searched in order to identify the second circuit to which the shorted circuit is connected. In this mode a low-level potential is imposed between the node known to be shorted or a component connected to that node and a ground trace on the printed circuit board or other extensive trace to be used as a reference. The signal that is imposed is an AC signal. The signal is preferably of such a low voltage level as not to have any effect on unpowered circuits, i.e., below diode threshold levels so as not to damage the circuits under test. A probe is then scanned over the printed circuit board at a distance to see where the electric field potential becomes closer to the shorted node potential than the reference potential. Capacitive coupling occurs between the probe tip and the circuits carrying the impressed voltage. The coupling is weak but detectable because of the impedance of the probe is quite high. The potential detected by the probe is filtered and compared with the impressed potential. The result is filtered, amplified, and synchronously demodulated to reject noise, provide a usable signal level, and increase sensitivity. As a convenient assistance to the operator a numerical reading of the relative potential of the probe tip may be provided, as well as, a bar graph whose magnitude relates to the magnitude to the relative potential detected by the probe or other visual indication of the relative potential. A high potential over a trace that should not be connected to the node that is shorted serves to identify such trace as an improperly connected trace.

When the second of the two circuits, in this case traces, which is shorted to the first is identified through the above method or otherwise; then, the second mode of operation, which will be referred to as the trace mode, may be used in order to locate the physical site of the short. The short locator is connected to both of the circuits which are shorted together and an alternating current signal is injected by impressing a potential between the two shorted networks. Preferably, the signal level is low, too low to have an effect on the unpowered circuits as disclosed above. Points along the traces in the circuits are contacted by a high impedance probe. The signal picked up by the high impedance probe is filtered and compared with the impressed potential. Preferably the potential of this signal is compared with a reference potential between the potential of the contact points on the two traces. The result of the comparison is further filtered, and amplified, and synchronously demodulated to reject noise, provide a usuable signal level, and increase sensitivity. The potential of this signal is compared with a reference potential between the potential of the contact points on the two traces. In order to assist the operator, the value of the relative potential may be displayed. A graphic display or other visual display of the relative value may also be provided along withthe indication of one or more previous values measured in order to provide an indication of whether potential is changing at positions along a trace or remaining fixed as the probe moves along a branch of a trace. The short is located by following the changing signal level along one network, ignoring branches of constant signal level. When the probe reaches the point where the short is located, all branches from that point will have the same level reading, except the one from the injecting probe. When a short is located on an inside layer trace, which is accessible only by its end points, one point will be on the changing level path from the injecting probe, and the other will be on a constant level from that end point on.

Figure 1:
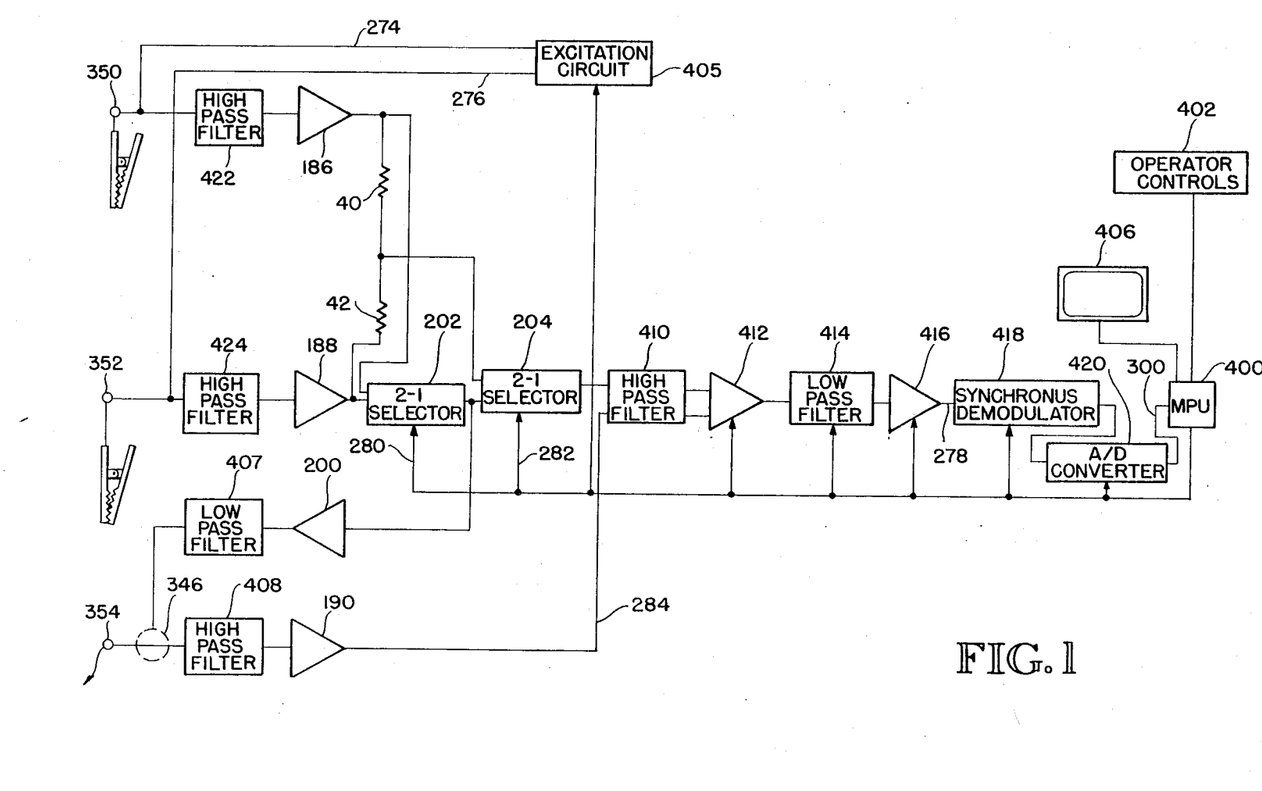
FIG. 1 is a block diagram of the preferred embodiment of a short circuit locator.

The preferred embodiment and its operation are illustrated schematically in FIG. 1. The circuit is operated under the control of a central processing unit such as the software controlled MPU 400 including memory. The device is controlled through operator controls 402 and the circuit responses are monitored on visual display 406. An exitation signal is provided by excitation circuit 405 under the control of the MPU. By way of example an excitation signal having frequency of 18 kH$_z$ generated under the control of the MPU may be used. Other frequencies may be used which are preferably in the very low or low radio frequency range although other frequencies outside this range are usable. The excitation signal is applied by connections 274 and 276 to the circuits under test. The signal is impressed on the circuits under test by way of clips or other connectors on connections 350 and 352. The response of the circuits under test is measured by means of a probe on connection 354. The response as detected by the probe is first filtered such as by filter 408 consisting of a high-pass filter having a cut-off frequency of 1 kH$_z$. The measured signal then passes through buffer 190. This signal is amplified with respect to a reference signal originating on lines 350 or 352 or a combination of both. Preferably it is amplified with reference to the signal on line 350 or 352 in the field mode and with respect to a potential between the lines 350 and 352 in the trace mode. Because current runs through clips in the trace mode and because the measured potential will be between the clip potentials in the trace mode the probe voltage is compared to an average potential between those of the clips. The signals from line 350 and 352 are processed through high-pass filters such as filters 422 and 424 respectively having cut-off frequencies of 15 Hz. The signals then pass through buffers 186 and 188 respectively. The filtered and buffered signals from lines 350 and 352 are then connected to a 2 to 1 data selector 202. The data selector is under the control of the MPU 400. The output of the data selector passes one of the inputs to another 2 to 1 data selector 204. The other input of the data selector 204 is connected to a signal which represents a signal with a potential between the filtered and buffered signals from lines 350 and 352. This is accomplished such as through the use of the voltage divider network formed by resistors 40 and 42. The output of data selector 202 is also connected through buffer 200 and a filter, such as low-pass filter 407 having a critical frequency of 1.6 MH$^z$ to the probe shield. The signals are both filtered such as through high-pass filter 410 having a characteristic frequency of 3.4 kH$_z$. The differential signal is then amplified in differential amplifier 412. The differential signal is further filtered, such as through a low-pass filter 414. This filter has a cut-off frequency of 28 kH$_z$ in order to cut out additional noise. The filtered differential signal is then amplified further such as through the use of amplifier 416. Preferably the gain of amplifiers 412 and 416 are controlled by the MPU. The differential signal then passes to a demodulator, such as the synchronous demodulator 418. The demodulator is also under the control of the MPU. The demodulated signal is then fed through an analog to digital convertor 420 which is controlled and has its output directed to the MPU 400. The MPU then may evaluate and cause the differential signals to be displayed.

Figure 2A:
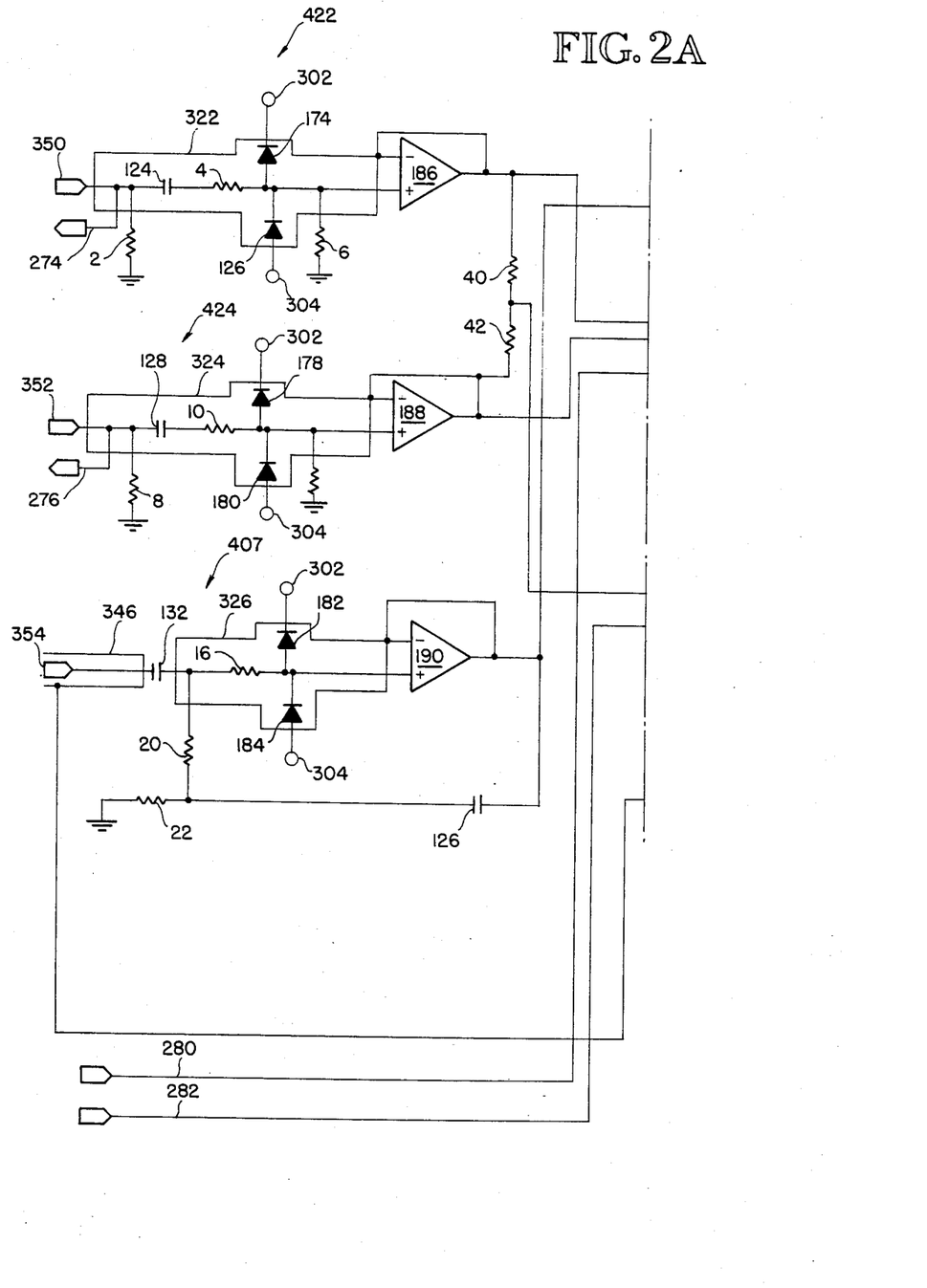
FIGS. 2 and 2A together, form a schematic diagram of the signal input and amplification circuits of the short circuit locator of FIG. 1.
Figure 2B:
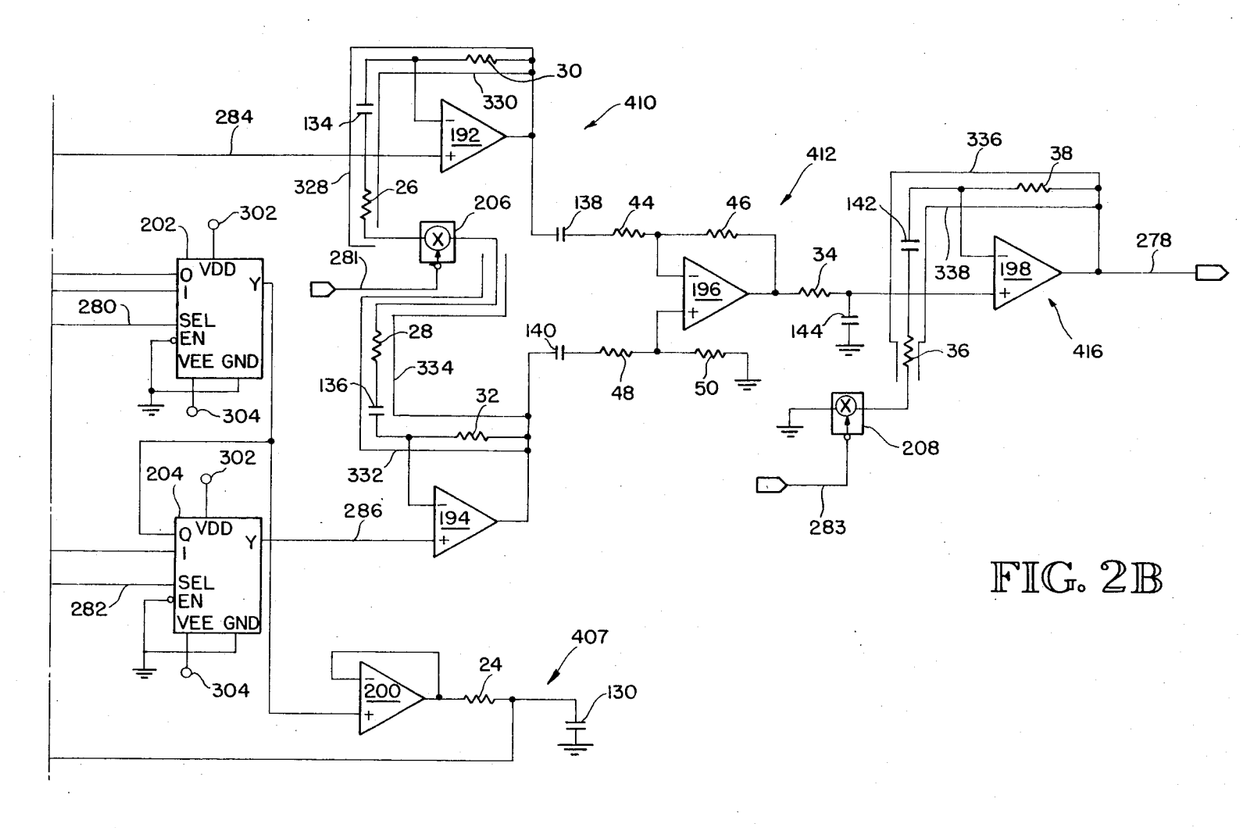

The preferred embodiment of the monitored and incoming signal processing means is illustrated in more detail in FIGS. 2A and 2B. Recommended component values and circuit parameters for this circuit and those found on the other drawing sheets may be found in the table below.

The signal on one clip on connection 350, as described above, is filtered and then passes through buffer 186. Electrostatic discharge protection is provided by diodes 174 and 176 which are connected to voltage supply connections 302 and 304 respectively. In order to reduce noise guard trace 322 is provided. The signal to be impressed on the clip is provided on connections 274.

A similar circuit is provided in connection with the other clip on connection 352. It also includes a filter network, guard trace 324, protective diodes 178 and 180, buffer 188 and an impressed signal line 276.

The output of buffers 186 and 188 are input into data selector 202. The data selector is controlled by a signal from the MPU on line 280.

The probe connection 354 and associated circuitry include probe shield 346. The probe shield is connected to the output of data selector 202 through buffer 200 and the low-pass filter formed by resistor 24 and capacitor 130. The reference trace potential is impressed on the shield in the field mode to prevent inaccurate measurements that would be caused if the tested circuits reference potential were different from the short locator's ground potential.

In the trace mode the reading taken by the probe must be very sensitive to be of value. The alternate connection of the probe shield to each of the clip potentials permits the MPU to determine in the trace mode if the probe is in contact with a circuit under test and therefore a meaningful of measurement can be taken and displayed. If the probe potential tends to follow the potential of the shield then the probe is considered to be not in contact with an external circuit. In order to aid in noise rejection a guard trace 326 is provided.

The probe input circuitry further includes protective diodes 182 and 184 as well as a high-pass filter. In order to increase the input impedance of the probe resistors 20 and 22 and capacitor 126 are provided. A high input impedance is particularly important in the field mode.

The output signal from buffer 190 is then fed on connection 284 to one input of a differential amplifier having high-pass characteristics and formed, in part, by operational amplifiers 192, 194 and 196. This amplifier has its second input connected to the output of data selector 204 on line 286. As described above, this data selector has an output selectable between a signal which is the average of the output of buffers 186 and 188 or the output of buffer 186 or buffer 188. It is controlled by a signal from the MPU on line 282. Guard traces 328, 330, 332 and 334 are provided in connection with this differential amplifier circuitry in order to reduce noise. Switch 206, controlled on connection 281 carrying a signal from the MPU, may be used to adjust the gain of this differential amplifier.

The output of the differential amplifier is then fed through the low-pass filter formed by resistor 34 and capicator 144 and then through amplifier 198. Through the use of switch 208 the gain of the amplifier 198 may be controlled on connection 283 which is connected to the MPU. Ideally the gain of this and the above described amplifiers are kept as low as possible to limit noise, yet still providing a sufficient level of sensitivity. Guard traces 336 and 338 are provided to help reject noise. The output of amplifier 198, found on connection 278 is a filtered signal representing the difference between a signal at the probe and either a signal representative of signals on connections 350 or 352 or their average.

Figure 4:
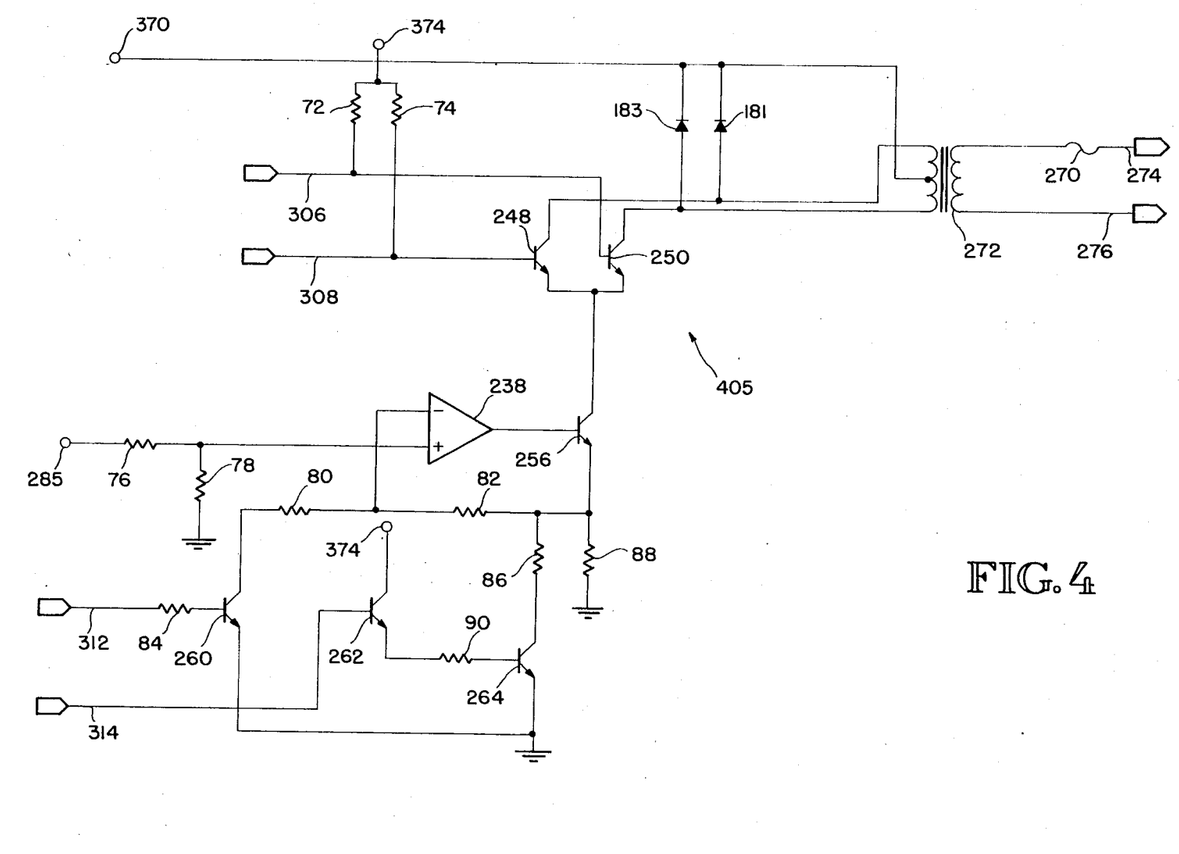
FIG. 4 is a schematic diagram of the excitation circuit of the short circuit locator of FIG. 1.

The excitation circuitry is described in more detail in FIG. 4. A 18 KH$_z$ signal is generated by the MPU and introduced on conductors 306 and 308. A current control actuated by a digital input from the MPU on conductors 312 and 314 is provided. In the trace mode thin traces require less current than a wide trace and therefore the current magnitude is adjusted accordingly. Preferably the excitation level is kept as high as possible. The current control circuit is composed of transistors 248, 250, 256, 260, 262, 264 and operational amplifier 238 and the associated resistors. The digital signal on conductors 306 and 308 is fed through the impedance transformer 272 from where it is introduced to the clips 350,352 on conductors 274 and 276.

A fuse is provided in the output of the transformer and has an impedance which is low enough to not adversely affect the operation of the circuits.

Clamping diodes 181 and 183 are provided on the input to the transformer to limit the transformer voltage when the clips are open.

Figure 3A:
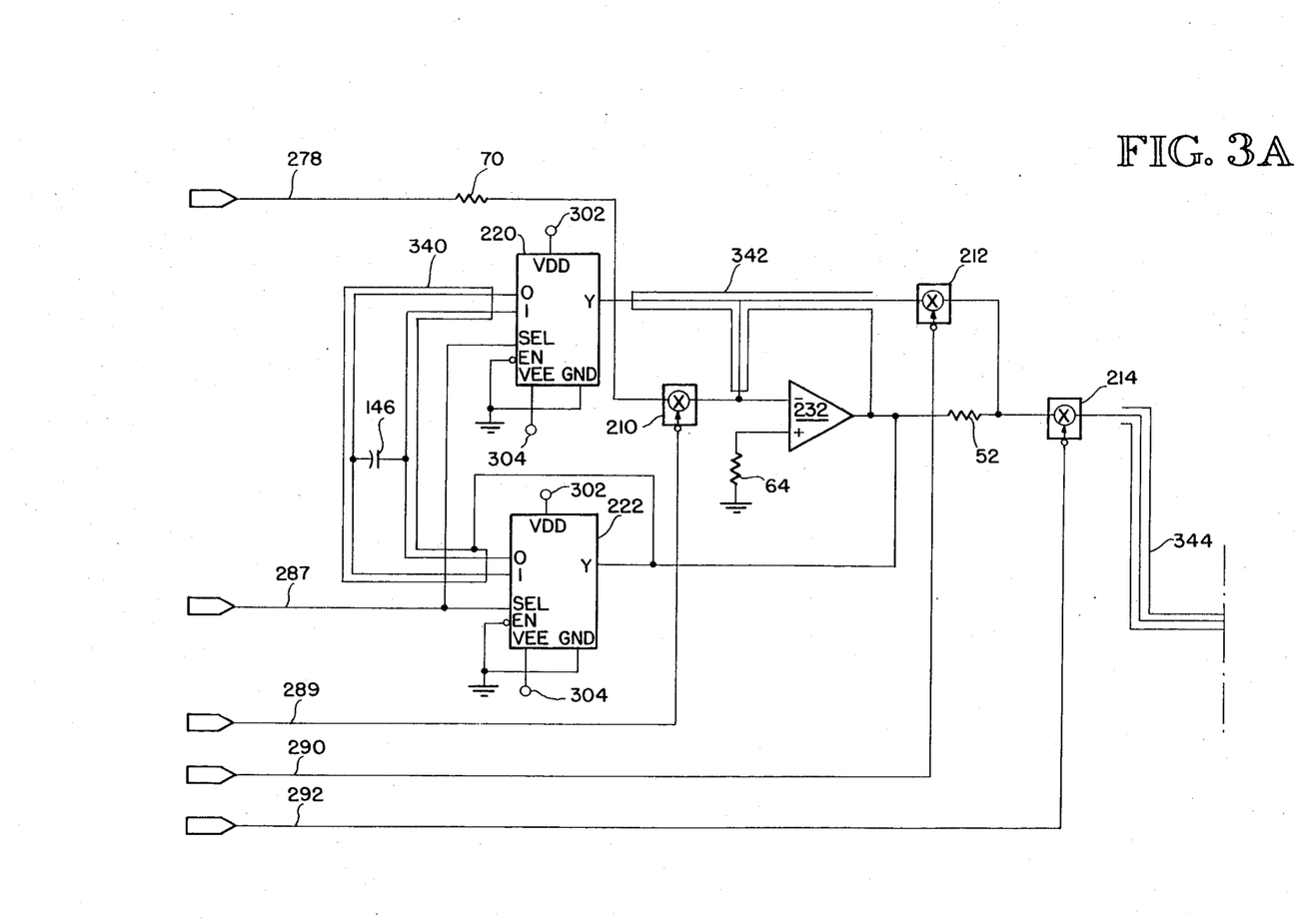
FIGS. 3A and 3B together, form a schematic diagram of the signal demodulation and analog to digital conversion circuits of the short circuit locator of FIG. 1.

The demodulation circuitry is shown in more detail in FIG. 3A. The demodulation circuitry receives the filtered and amplified differential signal on conductor 278. This signal is then introduced to integrating amplifier 232. In order to perform the demodulating function, the feedback capacitor 146 is flip-flopped under the control of the 2 to 1 data selectors 220 and 222. The data selectors are operated under the control of the MPU through connection 287 which carries a signal which is synchronous with the digital signals on conductors 306 and 308 coming from the MPU on which the exitation signal is based. Switch 210 is controlled by a digital signal from the MPU on conductor 289 and serves to stop and start the integrator. Switch 214, controlled by the digital signal from the MPU on conductor 292, transfers the output signal from the integrator to the analog to digital converter. Switch 212, also controlled by a digital signal from the MPU, on conductor 290, is utilized to reset the integrator by discharging capacitor 146 through resistor 52. Guard traces 340, 342, and 344 are provided to reduce noise level. When the end of one-half cycle of the carrier, i.e., excitation, signal ends, since the carrier signal is reversing polarity, the integration is stopped and the connections on integration capacitor 146 are reversed. Then the integration is resumed. At the end of the next half cycle of the carrier frequency the integration is again stopped and the capacitor connections reversed. The integration is then resumed. After a selected number of cycles of the carrier, the integration is stopped, and the output of the integrator is transferred to the analog to digital converter. The longer the integration period the more narrow the band-width of the demodulator, i.e., the more selective the circuit is to the injected signal response. This permits working with millivolt signal levels with microvolt resolution. The demodulator thus serves to amplify and filter the differential signal further. After the signal has been transferred to the analog to digital converter the integrator is reset and another measurement may begin.

Figure 3B:
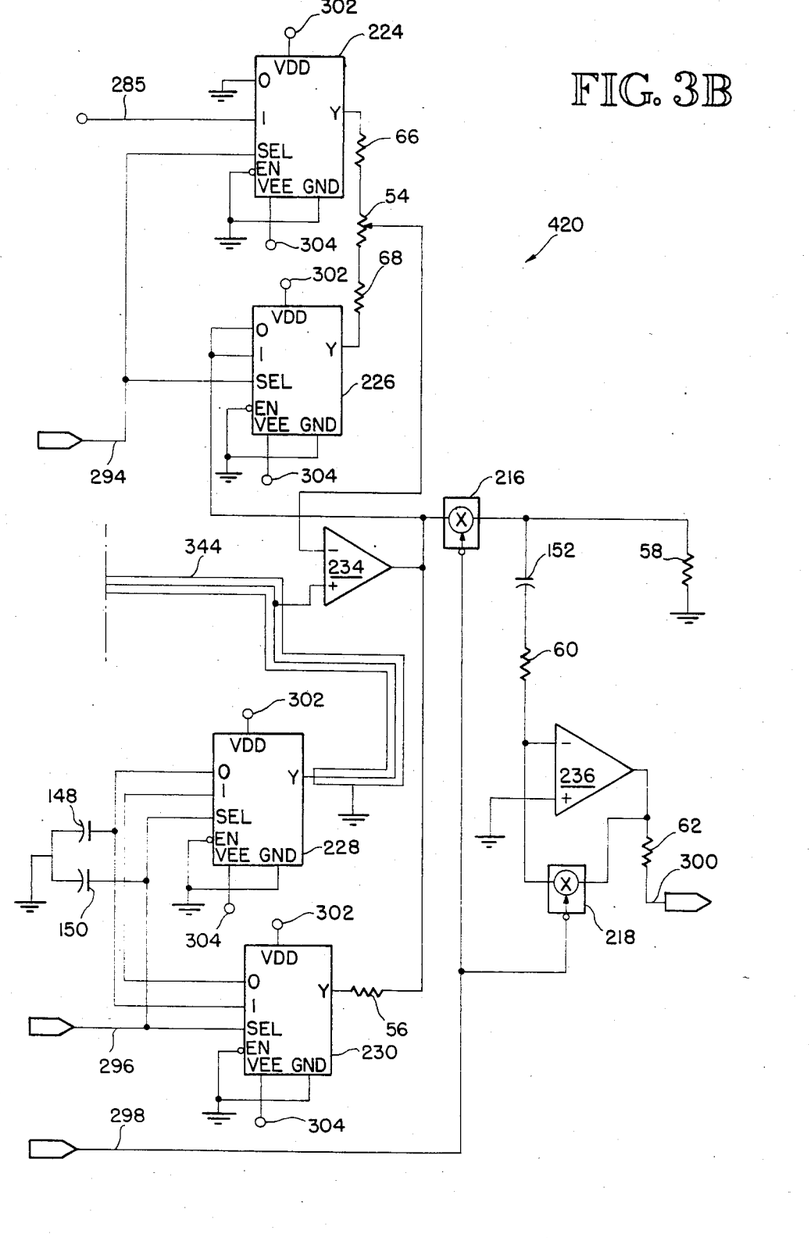

Details of the analog to digital converter are illustrated in FIG. 3B. The type of analog to digital converter preferred is a recycling remainder converter although other types of converters may be utilized. The conversion is controlled by digital signals from the MPU on conductors 294, 296 and 298. The output of the converter on conductor 300 provides a bit stream representative of the magnitude of output signal from the demodulator circuit. The output of the demodulator circuit causes a voltage to appear on either capacitor 148 or 150. The switch 214 serves as a gate to transfer the integrater output to one or the other of the capacitors. The digital signal on connection 296 actuates the 2 to 1 data selectors 228 and 320 to determine which capacitor is charged. This capacitor voltage is compared with a reference voltage signal, $V_r$ appearing on conductor 285. If the voltage is greater than ½ of the reference voltage then a voltage is impressed on the other capacitor of the pair which is equal to twice the first capacitor voltage less the reference voltage. If the voltage is not greater than ½ of the reference voltage then a voltage equal to twice the first capacitor voltages is impressed on the second capacitor. If the first condition occurs logic one is provided on connection 300. If the second condition occurs then a logic zero is provided on connection 300. This sequence is repeated a selected number of times. In other words, an evaluation is made to see if $2V_n - V_r$ is greater than zero and if it is then $V_{n+1} = 2V_n - V_r$ where $V_n$ represents the capacitor voltage being monitored during step n. If $2V_n - 2V_r$ is not greater than zero then $V_{n+1} = 2V_n$. Preferably this is repeated for up to 15 output bits. The subtraction function is provided by 2 to 1 data selectors 224 and 226. Data selector 226 performs a critical impedance matching function in the circuit.

Figure 6:
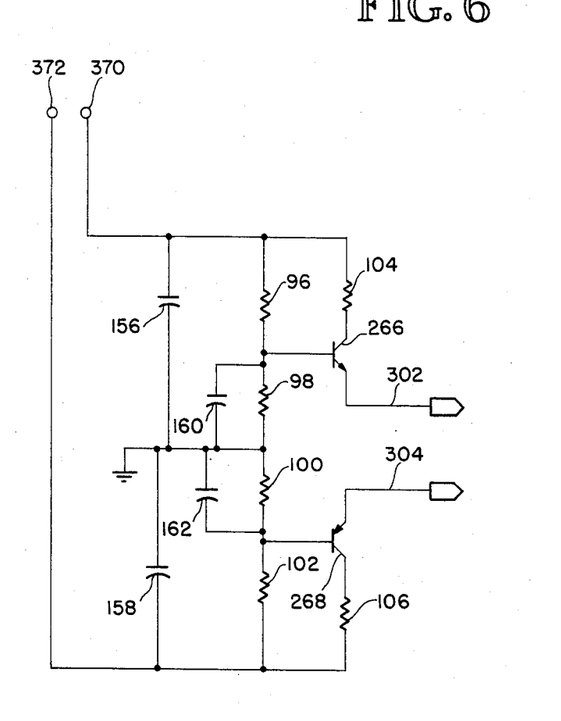
FIG. 6 is a schematic diagram of the a portion of the power supply of the short circuit locator of FIG. 1, the remainder of the power supply components not being illustrated as it is in a similar manner conventional.

FIG. 6 illustrates the circuitry which supplies supply voltages on conductors 302 and 304. The remainder of the power supply components are not illustrated as they are, in a similar manner, conventional and well known in the art.

Figure 5:
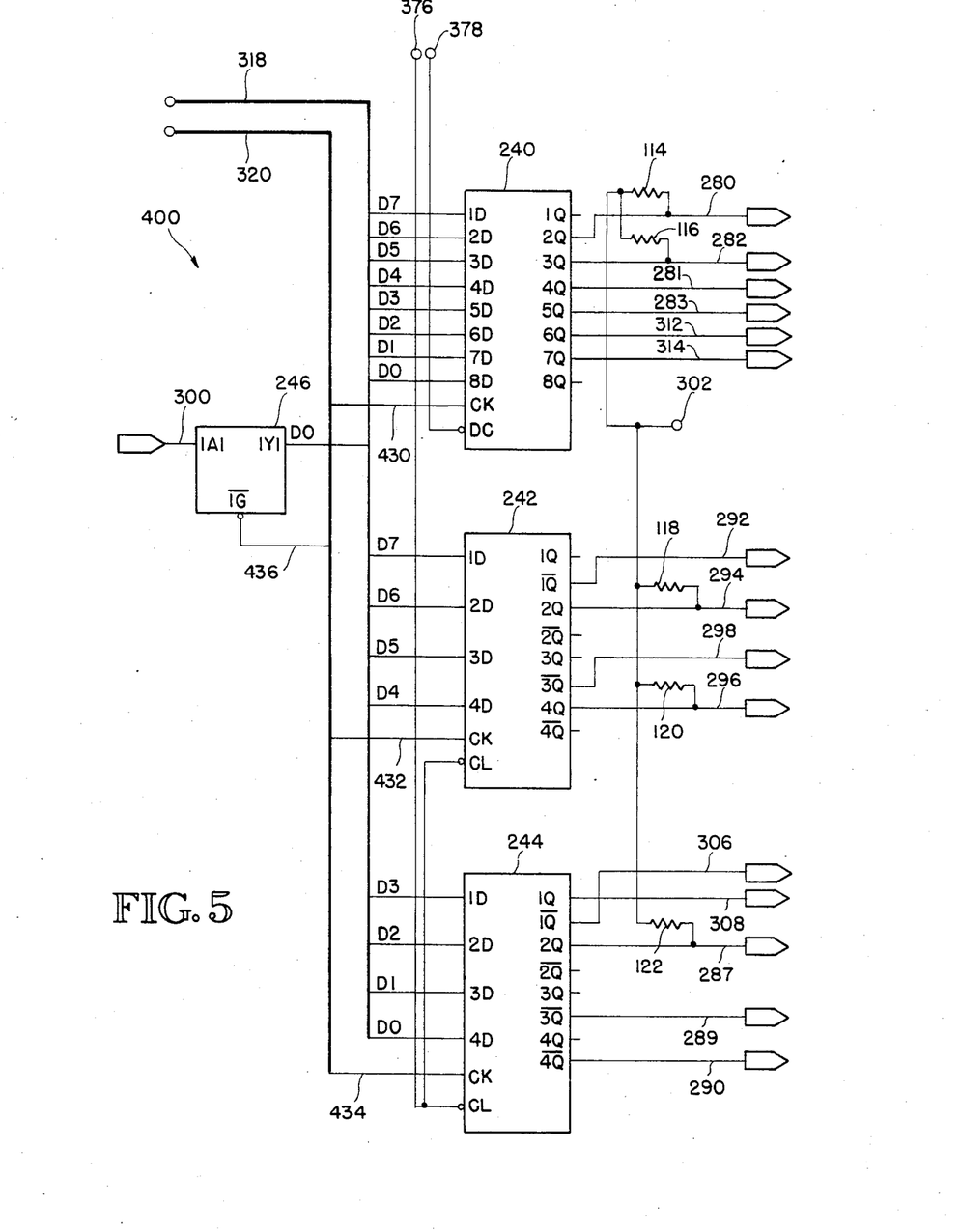
FIG. 5 is a schematic diagram of the MPU interface of the short circuit locator of FIG. 1.

FIG. 5 illustrates the latches 240, 242, 244 and 246 which are used in connection with signals on lines 430, 432, 434 and 436 to strobe data to and from the MPU. 318 represents the data lines from the MPU and 320 represents device selects from the MPU.

All values in ohms (Ω) with tolerances ±5% except as noted

| 2 | 10k | 62 | 15k | |
|---|---|---|---|---|
| 4 | 10k | 64 | 10k | |
| 6 | 1 M | 66 | 10k | |
| 8 | 10k | 68 | 10k | |
| 10 | 10k | 70 | 10k | |
| 12 | 1 M | 72 | 1k | |
| 16 | 10k | 76 | 4.64k | 1% |
| 20 | 82k | 80 | 1.07k | 1% |
| 22 | 82k | 82 | 33.2k | 1% |
| 24 | 100 | 84 | 10k | |
| 26 | 2.4k | 86 | 49.9 | 1% |
| 28 | 2.4k | 88 | 348 | 1% |
| 30 | 11k | 90 | 820 | |
| 32 | 11k | 96 | 560 | |
| 34 | 11k | 98 | 1k | |
| 36 | 2.7k | 100 | 820 | |
| 38 | 82k | 102 | 1k | |
| 40 | 10k | 104 | 100 | |
| 42 | 10k | 106 | 100 | |
| 44 | 10k | 108 | 2.7k | |
| 46 | 10k | 110 | 1k | |
| 48 | 10k | 114 | 1k | |
| 50 | 10k | 116 | 1k | |
| 1 | 820 | 118 | 1k | |
| 54 | 100 | variable 120 | 1k | |
| 56 | 820 | 122 | 1k | |
| 58 | 10k | 60 | 2.4k | |

All values in farads (F) with tolerances ±10% except as noted

| 124 | .01μ | 500 V |
|---|---|---|
| 126 | .01μ | |
| 128 | .01μ | 500 V |
| 130 | .001μ | |
| 132 | .01μ | |
| 134 | 5 n | |
| 136 | 5 n | |
| 138 | 560 p | |
| 140 | 560 p | |
| 142 | 5 n | |
| 144 | 560 p | |
| 146 | .15μ | |
| 148 | .15μ | |
| 150 | .15μ | |
| 152 | 5 n | |
| 156 | .01μ | |
| 158 | .01μ | |
| 160 | .01μ | |
| 162 | .01μ | |
| 164 | .01μ | |
| 174 | 1N4148 | Diodes |
| 176 | 1N4148 | Diodes |
| 178 | 1N4148 | Diodes |
| 180 | 1N4148 | Diodes |
| 181 | 1N4148 | Diodes |
| 182 | 1N4148 | Diodes |
| 183 | 1N4148 | Diodes |
| 184 | 1N4148 | Diodes |
| 186 | LF347 | Operational Amplifier |
| 188 | LF347 | Operational Amplifier |
| 190 | LF347 | Operational Amplifier |
| 192 | LF347 | Operational Amplifier |
| 194 | LF347 | Operational Amplifier |
| 196 | LF347 | Operational Amplifier |
| 198 | LF347 | Operational Amplifier |
| 200 | LF347 | Operational Amplifier |
| 202 | CD4053 | 2:1 Data selector/multiplexer |
| 204 | CD4053 | 2:1 Data selector/multiplexer |
| 206 | SW201 | Analog Switch |
| 208 | SW201 | Analog Switch |
| 210 | SW201 | Analog Switch |
| 212 | SW201 | Analog Switch |
| 214 | SW201 | Analog Switch |
| 216 | SW201 | Analog Switch |
| 218 | SW201 | Analog Switch |
| 220 | CD4053 | 2:1 Data selector/multiplexer |
| 222 | CD4053 | 2:1 Data selector/multiplexer |
| 224 | CD4053 | 2:1 Data selector/multiplexer |
| 226 | CD4053 | 2:1 Data selector/multiplexer |
| 228 | CD4053 | 2:1 Data selector/multiplexer |
| 230 | CD4053 | 2:1 Data selector/multiplexer |
| 232 | LF347 | Operational amplifier |
| 234 | LF347 | Operational amplifier |
| 236 | LF347 | Operational amplifier |
| 238 | LF347 | Operational amplifier |
| 240 | LS374 | Octal Latch |
| 242 | LS174 | Quad flip-flop |
| 244 | LS174 | Quad flip-flop |
| 246 | LS244 | Live receiver |
| 248 | 2N2222 | Transistor |
| 250 | 2N2222 | Transistor |
| 256 | 2N2222 | Transistor |
| 260 | 2N3904 | Transistor |
| 262 | 2N3904 | Transistor |

-continued

| 264 | 2N3904 | Transistor |
| 268 | 2N3904 | Transistor |
| 270 | 102 A | Fuse |
| 272 | 40:2 | 250 H Transformer |

Supplied Voltages all direct current (DC)

| 302 | −5 V |
| 304 | +8 V |
| 370 | +12 V filtered |
| 372 | −12 V filtered |
| 374 | +5 V |
| 285 | +6.4 V |
| 376 | Logic true |
| 378 | Logic false |

While this invention has been described in conjunction with a specific embodiment of the shorts locator for use with printed circuit boards it should be understood that these are merely illustrative. Numerous modifications and alterations may be made to the apparatus, in its use, and the methods employed without departing from the spirit and scope of the invention, and it is intended that the patent shall cover whatever features and processes of patentable novelty exist in the invention and are encompassed within the following claims.

What is claimed is:

1. A non-contact method for locating a second circuit which is shorted to a first circuit, such as those that may be present on printed circuit boards, which comprises the steps of:
   a. applying an alternating current signal of a relatively high frequency and low voltage between the first circuit and an extensive reference circuit to induce a signal in the second circuit;
   b. detecting the field created nearby the circuits by scanning over the circuits at a distance with a high impedance field sensitive probe in order to detect the field developed in response to the applied signal;
   c. comparing the response detected by the probe to the applied signal in order to provide an output representative of the relative potential of the field detected by the probe; and
   d. providing an indication of the relative value of the field detected by the probe, in response to the result of the comparison, whereby a potential detected by the probe in the second circuit which should not be connected to the first circuit indicates that the second circuit is shorted to the first circuit.

2. The method of claim 1 wherein the relatively high frequency is approximately 18 Khz and the low voltage is in the millivolt range.

3. The method of claim 1 wherein after the comparing step and before the indication providing step the output of the comparing step is demodulated by inverting every other half cycle of the comparison output and integrating the inverted half cycles with the non-inverted half cycles to improve the sensitivity of the detecting step.

4. The method of claim 1 including the step of shielding the probe with a shield at the potential of the extensive reference circuit to prevent inaccurate measurements of the field developed in response to the applied signal.

5. A non-contact short locator for locating a second circuit which is shorted to a first circuit, which comprises:
   a. means for applying an alternating current signal of a relatively high frequency and low voltage between the first circuit and an extensive reference circuit to induce a signal in the second circuit;
   b. a high impedance field sensitive probe for scanning over the circuits at a distance having an output responsive to the field developed in response to the applied signal;
   c. means for comparing the response detected by the probe to the applied signal in order to provide an output representative of the relative potential of the field detected by the probe; and
   d. means for indicating the relative value of the field detected by the probe, in response to the result of the comparison, whereby a potential detected by the probe in the second circuit which should not be connected to the first circuit indicates that the second circuit is shorted to the first circuit.

6. The short locator of claim 5 wherein the signal applying means has means for applying the signal at the relatively high frequency of approximately 18 Khz and the low voltage in the millivolt range.

7. The short locator of claim 5 including means for demodulating the output of the comparing means by inverting every other half cycle of the comparison output and integrating the inverted half cycle with the non-inverted half cycles to improve the sensitivity of the detecting step.

8. The short locator of claim 5 including a shield around the probe having means for maintaining the potential of the probe approximately at the potential of the extensive reference circuit to prevent innacurate measurements of the field developed in response to the applied signal.

9. A method of detecting the precise location of a known circuit between a first circuit and a second circuit, such as those that may be present on printed circuit boards, which comprises the steps of:
   a. applying an alternating current signal having a relatively high frequency and low voltage between a first node located in the first circuit and a second node located in the second circuit to form a current path including at least an exposed part of the first circuit, the path created by the short circuit and at least an exposed part of the second circuit;
   b. contacting selected, exposed points in the shorted circuits with a voltage sensitive probe in order to detect the relative potential of the points contacted;
   c. comparing the response detected by the probe to an average of the potentials applied to the nodes in order to provide an output representative of the relative potentials of the selected points contacted; and
   d. providing an indication of the relative potential of the selected points whereby a changing potential along the exposed parts of the circuits indicates the absence of the short and a constant potential, except in the direction along the current path of the applied signal, indicates the precise location of the short on the injected current path.

10. The method of claim 9 wherein relatively high frequency is approximately 18 Khz and the low voltage is in the millivolt range.

11. The method of claim 9 wherein after the comparing step and before the indication providing step the output of the comparing step is demodulated by inverting every other half cycle of the comparison output and integrating the inverted half cycles with the non-inverted half cycles to improve the sensitivity of the detecting step.

12. A short locator for locating the precise location of a short circuit between a first circuit and a second circuit, such as those that may be present on printed circuit boards, which comprises:
 a. means for applying an alternating current signal having a relatively high frequency and low voltage between a first node located in the first circuit and a second node located in the second circuit to form a current path including at least an exposed part of the first circuit, the path created by the short circuit and at least an exposed part of the second circuit;
 b. a voltage sensitive probe for contacting selected other points in the shorted circuits in order to detect the relative potential of the points contacted;
 c. means for comparing the response detected by the probe to an average of the potentials applied to the nodes in order to provide an output representative of the relative potentials of the selected points contacted; and
 d. means for indicating the relative potential of the selected points, in response to the output of the comparison means, whereby a changing potential along the exposed circuit parts indicates the absence of the short and a constant potential, except in the direction along the current path of the applied signal, indicates the precise location of the short on the injected current path.

13. The short locator of claim 12 wherein the signal applying means has means for applying the signal at the relatively high frequency of approximately 18 Khz and the low voltage in the millivolt range.

14. The short locator of claim 12 including means for demodulating the output of the comparing means by inverting every other half cycle of the comparison output and integrating the inverted half cycles with the non-inverted half cycles to improve the sensitivity of the locator.

* * * * *